(12) United States Patent
Davuluri et al.

(10) Patent No.: US 7,233,025 B2
(45) Date of Patent: Jun. 19, 2007

(54) ELECTRONIC PACKAGING FOR OPTICAL EMITTERS AND SENSORS

(75) Inventors: Pavan Davuluri, Sammamish, WA (US); Mario R. Cristancho, Redmond, WA (US); Krishna Darbha, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 90 days.

(21) Appl. No.: 11/270,504

(22) Filed: Nov. 10, 2005

(65) Prior Publication Data
US 2007/0102777 A1 May 10, 2007

(51) Int. Cl.
*H01L 27/15* (2006.01)
*H01L 29/267* (2006.01)
*H01L 31/12* (2006.01)
*H01L 33/00* (2006.01)

(52) U.S. Cl. ............................................ 257/81; 257/99
(58) Field of Classification Search .................. 257/13, 257/81, 82, 83, 99, 100, 431, 432, 433
See application file for complete search history.

(56) References Cited

U.S. PATENT DOCUMENTS 5,422,495 A * 6/1995 Cohn .......................... 250/573
6,300,942 B1 10/2001 Chin et al.
6,623,179 B2 * 9/2003 Hurt et al. ..................... 385/92
6,697,052 B2 2/2004 Shen et al.
6,927,759 B2 8/2005 Chang et al.
6,934,037 B2 8/2005 DePue et al.

(Continued)

OTHER PUBLICATIONS

Optical Mice Under Development, <http://www.three-fives.com/optoelectronic_news/aug05_opto_news/120805Optical_mice_development.htm>, Aug. 12, 2005; 3 pages.

(Continued)

*Primary Examiner*—S. V. Clark
(74) *Attorney, Agent, or Firm*—Banner & Witcoff, Ltd.

(57) ABSTRACT

A VCSEL die is packaged so that its optical axis is at a predetermined non-perpendicular and nonparallel angle relative to the plane of a PCB to which the packaged die will be mounted. The die is packaged to form an emitting component which is shaped to orient the VCSEL optical axis at the predetermined angle when the component is placed onto a PCB. The component can be used in combination with a flip-chip sensor IC located on an opposite side of a PCB from the emitting component. The component can also be used in combination with a CSP sensor IC on the same side of a PCB. A VCSEL die and sensor IC can be contained in a single package. The optical axis of the VCSEL die packaged with a sensor IC may or may not be perpendicular to a plane of an array in the sensor IC.

20 Claims, 12 Drawing Sheets

U.S. PATENT DOCUMENTS

| | | |
|---|---|---|
| 2002/0140677 A1 | 10/2002 | Misek et al. |
| 2003/0015717 A1* | 1/2003 | Ogawa ..................... 257/81 |
| 2003/0142075 A1 | 7/2003 | Chin |
| 2003/0142078 A1 | 7/2003 | Chin |
| 2003/0201951 A1 | 10/2003 | Chin |
| 2004/0066372 A1 | 4/2004 | Park et al. |
| 2004/0084610 A1 | 5/2004 | Leong et al. |
| 2004/0149894 A1 | 8/2004 | Tschirren et al. |
| 2004/0233170 A1 | 11/2004 | Kang |
| 2004/0246232 A1 | 12/2004 | Chang et al. |
| 2005/0001818 A1 | 1/2005 | Chang et al. |
| 2005/0024336 A1 | 2/2005 | Xie et al. |
| 2005/0035946 A1 | 2/2005 | Wang |
| 2005/0093825 A1 | 5/2005 | Chang et al. |
| 2005/0100288 A1 | 5/2005 | Chu |
| 2005/0157202 A1 | 7/2005 | Lin et al. |
| 2005/0249449 A1* | 11/2005 | Welch et al. .................. 385/14 |
| 2006/0007148 A1* | 1/2006 | Theytaz et al. ............. 345/163 |
| 2007/0013661 A1* | 1/2007 | Theytaz et al. ............. 345/166 |

OTHER PUBLICATIONS

STMicroelectronics; Single Chip Solution from STMicroelectronics Powers New Microsoft Optical Mice, <http://www.st.com/stonline/press/news/year2001/t1091p.htm>, Dec. 4, 2001; 2 pages.

UniqueICs; Optical Mouse, <http://www.uniqueics.com/htmls/map.htm>, Date of first publication unknown, but prior to Sep. 1, 2005; 15 pages.

Agilent Technologies; Optical Mouse Points to the Future, <http://www.agilent.com/labs/news/2001features/fea_optinav.html>, Date of first publication unknown, but prior to Sep. 1, 2005, 4 pages.

* cited by examiner

ELECTRONIC PACKAGING FOR OPTICAL EMITTERS AND SENSORS

BACKGROUND

Many electronic devices include one or more components that emit light and one or more sensors that receive the emitted light. In some cases, the sensor may detect that light once it has been reflected from a surface that is external to the device. An emitting component (e.g., a light emitting diode (LED), a semiconductor laser, etc.) may be quite small. A sensor component, which may also be quite small, typically includes an integrated circuit (IC) chip having an array of photo-sensitive elements. Correctly positioning the emitting and sensing components is often crucial to proper operation of the device.

One example of a device employing emitting and sensing components is a computer mouse. In some designs, for example, a sensor (e.g., an imaging array) generates data for successive portions of a desk top or other external surface over which the mouse is moved. A processor in the mouse compares that data and determines the direction and distance of movement. The emitter (an LED or laser) must be positioned so that light is cast on the portion of the external surface from which the sensor captures reflected light. In many cases, it is beneficial or necessary to orient the emitter so that light strikes the external surface at an angle. In turn, this may require positioning the emitter at a particular angle relative to a printed circuit board (PCB) or other structure within the mouse.

FIG. 1 schematically shows one of several manners in which a desired orientation has typically been achieved. Main PCB A is internally attached to a housing B of a mouse. For simplicity, only a portion of PCB A and a portion of housing B are shown. In operation, the mouse moves across an external surface. Semiconductor laser C is attached to a separate PCB D, with flexible connector(s) E electrically connecting laser C to main PCB A. Separate PCB D is then positioned into the desired angle (I) relative to main PCB A with additional mounting hardware (not shown). Laser C emits a beam through opening F in main PCB A and through an opening G in housing B. That beam reflects from the external surface, re-enters opening G, and strikes an array of imaging (or other photosensitive) elements in sensor H. For simplicity, lenses and other optics in the path of the beam are not shown.

Configurations such as those shown in FIG. 1 have several disadvantages. For example, additional components are needed to mechanically and electrically attach the emitter to the main PCB. Moreover, correctly positioning those components increases assembly time. Ultimately, the added components and increased assembly time raise the overall cost of the mouse. The amount by which overall cost is increased can be significant, particularly for products which are manufactured in large quantities.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In some embodiments, a vertical cavity surface emitting laser (VCSEL) die or other type of emitting element is packaged so that its optical axis is at a predetermined angle relative to the plane of a printed circuit board (PCB) to which the packaged element will be mounted. That predetermined angle is non-perpendicular and nonparallel. The emitting element is packaged to form an emitting component which is shaped such that placement of the component on a PCB will orient the optical axis of the emitting element at the predetermined angle. The emitting component can be configured for mounting in a variety of manners. The component can be used in combination with a sensor integrated circuit (IC) that is packaged in a variety of manners. In some embodiments, the sensor IC is a flip-chip located on an opposite side of a PCB from the emitting component. In other embodiments, the sensor IC is a chip scale package located on the same side of a PCB as the emitting component.

In certain embodiments, an emitting element and a sensor IC are contained within a single package. In some of those embodiments, the optical axis of the emitting element is perpendicular to the plane of an array in the sensor IC. In other of those embodiments, the optical axis is at a non-perpendicular and nonparallel angle to the plane of the array. In some embodiments in which the optical axis is at a non-perpendicular and nonparallel angle to the plane of the array, the emitting element is positioned within the package so that the optical axis is at a non-perpendicular angle relative to a PCB on which the package is to be mounted. In still other embodiments, the sensor IC is positioned within the package so that the plane of the array is not parallel to the PCB on which the package is to be mounted. In yet other embodiments, the emitting element is positioned within the package so that the optical axis is at a non-perpendicular angle relative to a PCB on which the package is to be mounted, and the sensor IC is positioned within the package so that the plane of the array is not parallel to the PCB.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

As previous discussed, there are various disadvantages associated with prior art techniques for positioning an emitting element in a computer mouse or other device. In at least some embodiments of the invention, these disadvantages are reduced or avoided through novel packaging configurations for emitting and/or sensing elements. In at least some embodiments, the emitting element has a predetermined optical orientation within its package. In some cases, that predetermined orientation corresponds to the emitter/sensor orientation for the device into which the emitting element will be incorporated.

In the following description, various exemplary embodiments are explained by reference to components and systems in which the emitting element is a vertical cavity surface emitting laser (VCSEL) die. However, the invention is not limited to implementations which use a VCSEL die. The invention includes implementations in which the emitting element may be a light emitting diode (LED) die, an edge emitting laser diode (EELD) die, or other type of element that controllably emits light in response to application of electrical energy. As used throughout the specification (including the claims), "light" is used to refer light in visible wavelengths, as well as to light outside visible wavelengths. Persons skilled in the art will appreciate, in view of the following description, how the herein-described embodiments can be readily adapted to accommodate an LED die, an EELD die or another type of emitting element.

The following description also provides examples in which packaged emitting and/or sensor elements are incorporated into a computer mouse. As with the specific type of emitting element, however, the invention is not limited to implementations in a computer mouse. Instead, the invention also includes implementations in which emitting and/or sensing components are used in other types of electronic devices.

Figure 1:
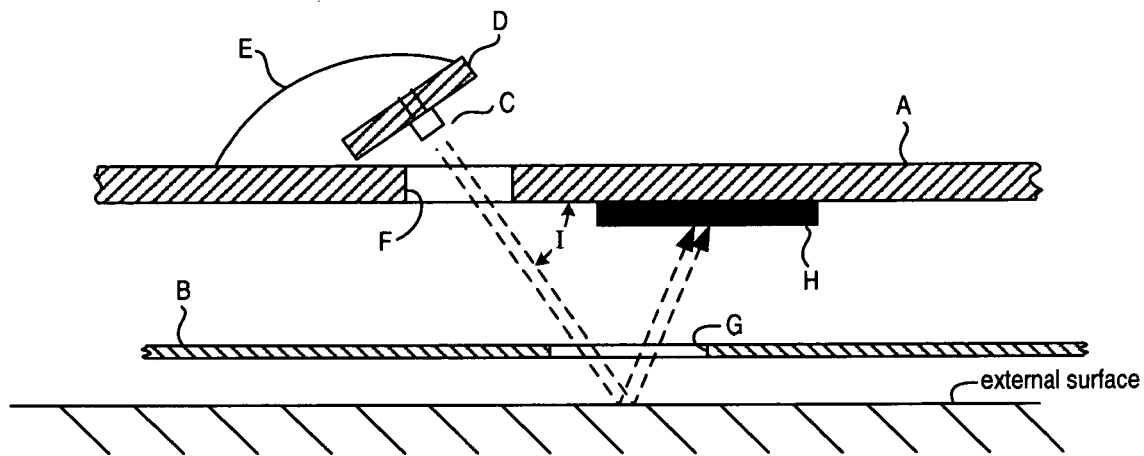
FIG. 1 shows a prior art manner of orienting a laser in a computer mouse.
Figure 2:
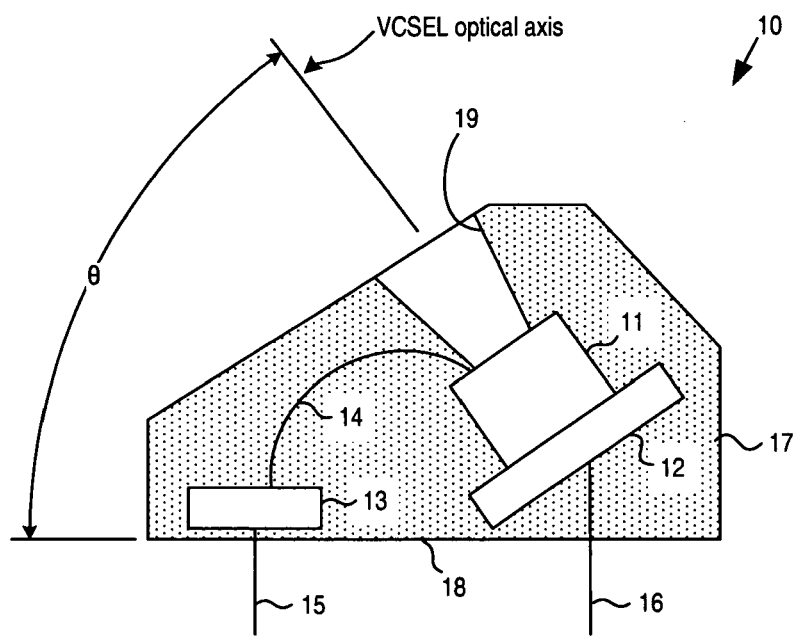
FIG. 2 is a cross-sectional diagram of a VCSEL package according to at least some exemplary embodiments.

FIG. 2 is cross sectional view of a VCSEL package 10 according to at least some embodiments of the invention. VCSEL package 10 includes a VCSEL die 11. One face of VCSEL die 11 is bonded to a lead frame 12 with conductive adhesive (not shown). Wire 14, which is attached to the opposite face of VCSEL die 11, connects that opposite face to a lead frame 13. Wires 15 and 16 are attached to lead frames 13 and 12, respectively. VCSEL die 11, lead frames 12 and 13, wire 14 and portions of wires 15 and 16 are enclosed within package material 17. Package material 17 may include any of numerous types of materials conventionally used for creating a plastic encapsulated microchip (PEM). Such materials include, but are not limited to, epoxy/plastic materials and ceramic materials. Notably, other types of package materials could be used in the embodiment of FIG. 2, as well as in other embodiments such as are described below. The invention is not limited by the type of package material chosen.

Although FIG. 2 and later drawing figures show a homogeneous package material, this need not be the case. In other words, package material 17 could be heterogeneous. For example, a first type of package material could be used in one region of the component (e.g., the base), a second type a material used in another region (e.g., around VCSEL die 17), etc. As used in this specification (including the claims), "package material" refers to both homogeneous and heterogeneous materials.

Wires 15 and 16 extend through package material 17 on a mounting face 18 of VCSEL package 10. An opening 19 in an upper face of VCSEL package 10 exposes the emitting cavity of VCSEL die 11. In some embodiments, opening 19 is truly open (i.e., the volume of opening 19 only contains air). In other embodiments, the volume of opening 19 is filled (in whole or in part) with a clear epoxy or other transparent material. VCSEL die 11 is positioned within package material 17 so that a beam emanating on the optical axis of VCSEL die 11 is at a predetermined angle θ to the plane of mounting face 18. As used herein, "optical axis" refers to an axis about which the light emanating from the emitting element is centered. In general, the optical axis is the center of the cone of light emanating from the emitting element. The width of the cone will vary based on the type and characteristics of a particular element. In at least some embodiments, a VCSEL die (or other type of emitting element) is positioned within package material so that the optical axis will be at a predetermined angle of between five and eighty-five degrees relative to a plane of a printed circuit board (PCB) to which the packaged component is designed for attachment. In other embodiments, that predetermined angle may range from zero to ninety degrees.

Figure 3:
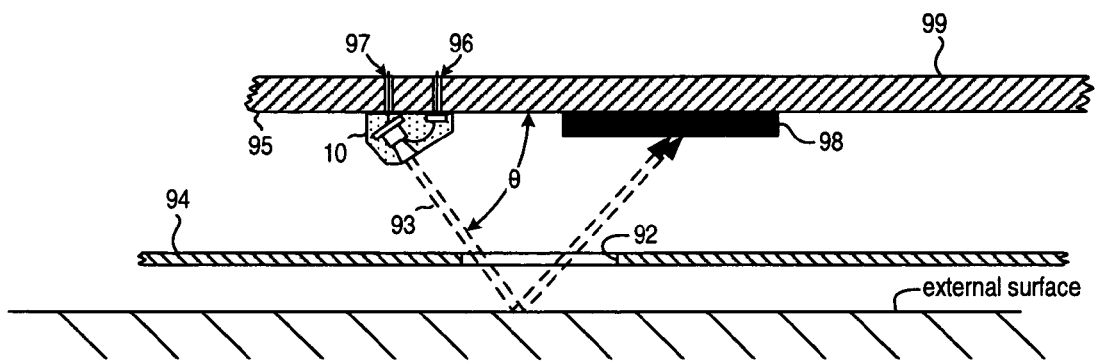
FIG. 3 is a cross-sectional diagram showing one example of how the VCSEL package of FIG. 2 may be incorporated into a computer mouse.

FIG. 3 is a cross-sectional diagram showing one example of how VCSEL package 10 may be incorporated into a computer mouse. FIG. 3 shows a portion of a PCB 99 and a portion of a housing 94 of the mouse, as well as a portion of the external surface over which the mouse is moved. For simplicity, certain components (e.g., lenses) are omitted from FIG. 3. Attached to the lower face 95 of PCB 99 is a sensor package 98. For simplicity, sensor package 98 is shown generically as a black box. Typically, sensor package 98 includes an integrated circuit (IC) chip having an array of photoreceptive elements (e.g., an imaging array or other elements processing light emitted by VCSEL die 11). The sensor IC may be packaged in any of numerous ways (e.g., plastic dual in-line package (PDIP), plastic lead chip carrier (PLCC), thin shrink small outline package (TSSOP), quad flat pack (QFP), small outline integrated circuit (SOIC), etc.). The packaged sensor IC may be joined to PCB 99 in any of a variety of manners (e.g., surface mount, through-hole mount, ball-grid array, etc.) Further details of the packaging and mounting of a sensor IC according to certain embodiments are provided in connection with FIGS. 10 through 15A.

As also shown in FIG. 3, VCSEL package 10 is attached to PCB 99 in a conventional manner. Specifically, wires 16 and 15 extend into through-holes 97 and 96 and are soldered into place (solder is not shown in FIG. 3). Mounting face 18 of VCSEL package 10 rests flush against lower face 95 of PCB 99. Because of its positioning within VCSEL package 10, VCSEL die 11 is thereby oriented to emit beam 93 at the angle θ relative to lower face 95 of PCB 99. Beam 93 passes through opening 92 in housing 94 and strikes a portion of the external surface. A part of beam 93 is then returned through opening 92 and is received by photoreceptive elements within sensor package 98. For simplicity, FIG. 3 shows a simple reflection of beam 93 from the external surface onto sensor package 98. In practice, however, a sensor IC within package 98 may be configured to detect and/or process speckling or other backscattering which is not a simple reflection.

Persons skilled in the art will appreciate an advantage of the arrangement shown in FIG. 3. Angle θ will often be dictated by the optical design of a mouse or other device. Stated differently, the mouse or other device must be assembled so that light from VCSEL die 11 is emitted at a specific angle to PCB 99 and/or other components in the device. Because VCSEL die 11 is angularly pre-positioned within its package, assembly of the mouse or other device is simplified. In particular, VCSEL package 10 is shaped such that placement of that package on PCB 99 in preparation for attachment thereto orients the optical axis of VCSEL die 11 at the predetermined angle θ relative to the lower face 95 of PCB 99 in the region of lower face 95 where VCSEL package 10 is installed. Because through-holes 97 and 96 can be precisely located on PCB 99 using conventional PCB manufacturing techniques, lateral positioning of VCSEL package 10 (and thus of VCSEL die 11) is also simple. When electrical contacts on VCSEL package 10 (wires 15 and 16) are attached (e.g., soldered) to corresponding contacts on PCB 99 (holes 96 and 97), the optical axis of VCSEL die 11 is secured at the predetermined angle θ.

Figure 4:
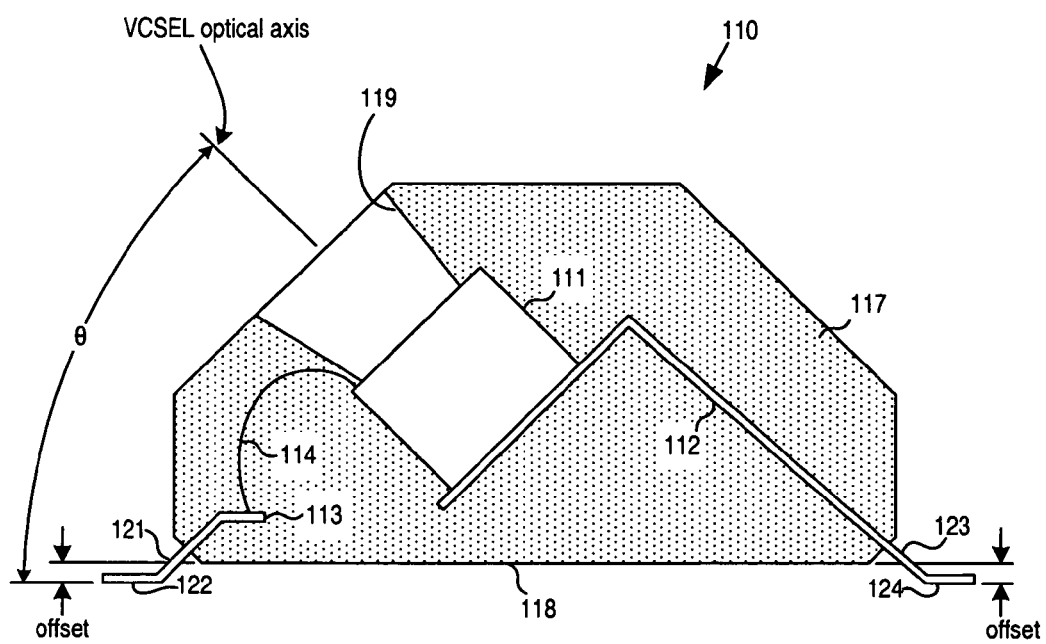
FIG. 4 is a cross-sectional diagram of a VCSEL package according another exemplary embodiment.

FIG. 4 is a cross-sectional diagram showing a VCSEL package 110 according to at least some additional embodiments of the invention. VCSEL package 110 is similar to VCSEL package 10 of FIG. 2, but is configured for surface mounting instead of through-hole mounting. One face of VCSEL die 111 is bonded to metal lead frame 112 with conductive adhesive (not shown). A wire 114 connects the opposite face of VCSEL die 111 to a second metal lead frame 113. VCSEL die 111, lead frames 112 and 113 and wire 114 are enclosed (in whole or in part) within package material 117. As with the embodiment of FIG. 2, package material 117 might include any of various materials commonly used to manufacture a PEM. Lead frame 113 is bent such that an end 121 of lead frame 113 extends from package material 117. The tip of end 121 is bent to form a mounting pad 122. Lead frame 112 is similarly arranged so that an end 123 extends from package material 117. The tip of end 123 is bent to form a mounting pad 124. Mounting pads 122 and 124 are parallel to mounting face 118 of VCSEL package 110. In the embodiment shown, pads 122 and 124 are slightly offset from the plane of mounting face 118. In other embodiments, one or both of pads 122 and 124 is not offset from the plane of mounting face 118, or is offset in a direction opposite from that shown in FIG. 4. An opening 119 in an upper face of VCSEL package 110 exposes the emitting cavity of VCSEL die 111. As in the embodiment of FIG. 2, the volume of opening 119 may be filled (in whole or in part) with a clear epoxy or other transparent material, or may be open to the air. VCSEL die 111 is positioned within package material 117 so that the optical axis of VCSEL die 111 is at a predetermined angle θ to a plane coincident with points on the lower faces of pads 122 and 124. In some embodiments, predetermined angle θ is between five and eighty-five degrees. In other embodiments, that predetermined angle may be between zero and ninety degrees.

Figure 5:
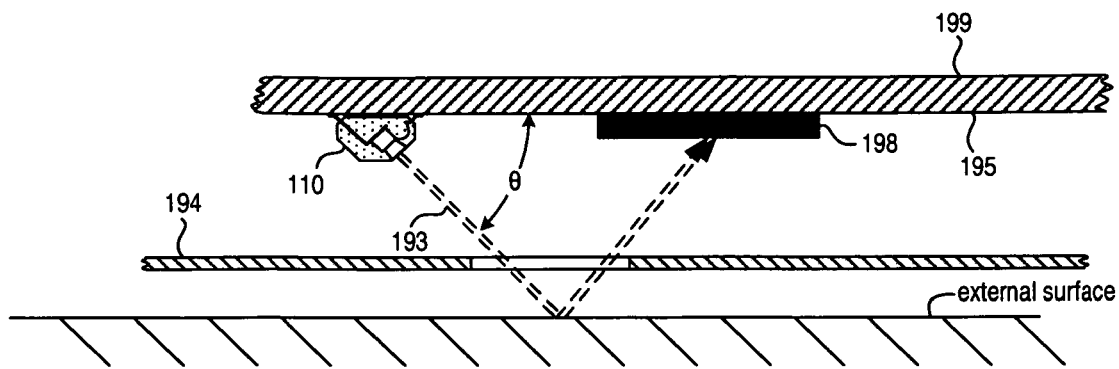
FIG. 5 is a cross-sectional diagram showing one example of how the VCSEL package of FIG. 4 may be incorporated into a computer mouse.

FIG. 5 is a cross-sectional diagram showing VCSEL package 110 incorporated into a computer mouse having a PCB 199, housing 194 and sensor package 198. As with the embodiment of FIG. 3, placing VCSEL package 110 on lower face 195 of PCB 199 orients the optical axis of VCSEL die 111 such that beam 193 from VCSEL die 111 is at the predetermined angle θ to the lower face 195 of PCB 199. Mounting pads (not shown) corresponding to mounting pads 122 and 124 of VCSEL package 110 are formed on lower face 195 of PCB 199 using known PCB manufacturing techniques. When electrical contacts on VCSEL package 110 (pads 122 and 124) are attached (e.g., soldered) to corresponding contacts on PCB 199 (pads on lower face 195), the optical axis of VCSEL die 111 is secured at the predetermined angle θ.

Figure 6:
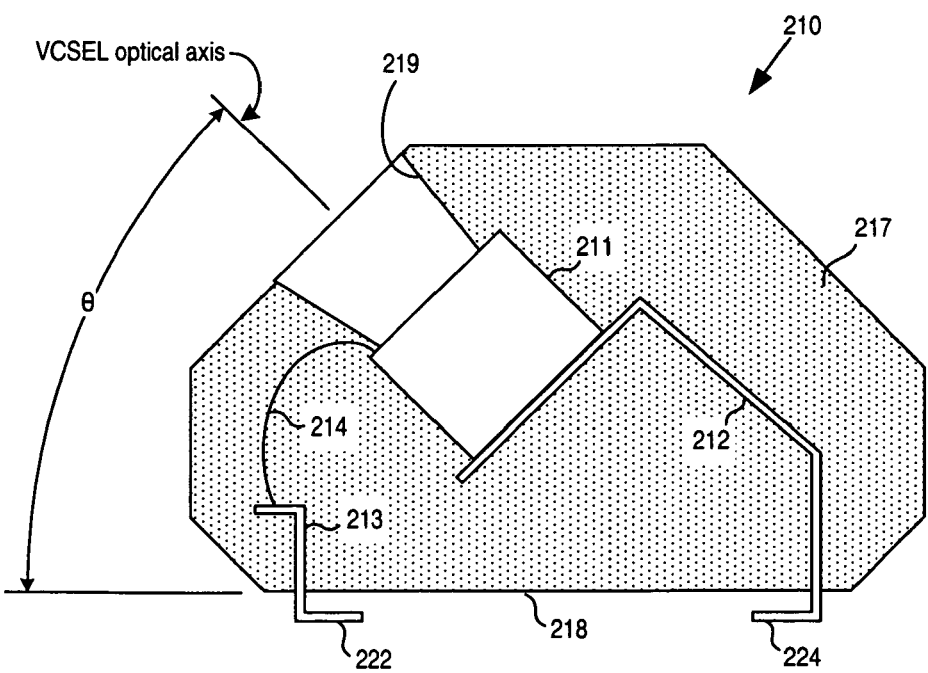
FIG. 6 is a cross-sectional diagram of a VCSEL package according to an additional exemplary embodiment.
Figure 7:
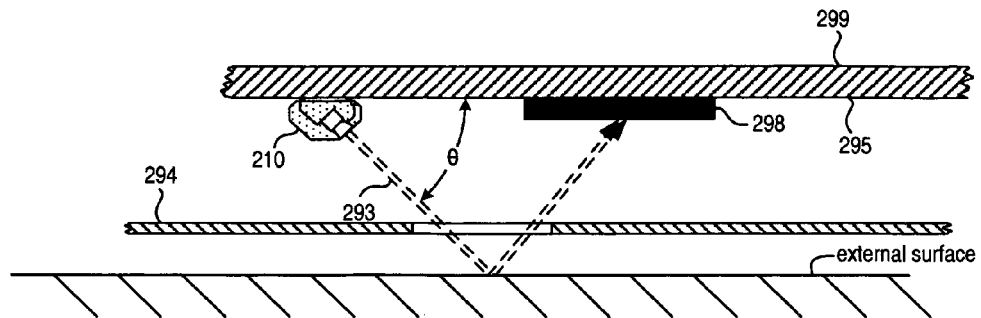
FIG. 7 is a cross-sectional diagram showing one example of how the VCSEL package of FIG. 6 may be incorporated into a computer mouse.

FIG. 6 is a cross-sectional diagram showing a VCSEL package 210 according to a slightly different embodiment. VCSEL package 210 is generally similar to VCSEL package 110 of FIG. 4, except that lead frames 212 and 213 are oriented somewhat differently. Instead of extending from the edges of the package material 217, pads 222 and 224 are formed on ends of lead frames 213 and 212 extending from mounting face 218. In other embodiments, one or both of pads 222 and 224 is flush with mounting face 218. FIG. 7 is a cross-sectional diagram showing VCSEL package 210 incorporated into a computer mouse having a PCB 299, housing 294 and sensor package 298. Similar to the embodiment of FIG. 5, positioning pads 222 and 224 of VCSEL package 210 on corresponding pads of lower face 295 of a mouse PCB 299 orients the optical axis of VCSEL die 211 at the predetermined angle θ relative to lower face 295. When electrical contacts on VCSEL package 210 (pads 222 and 224) are attached (e.g., soldered) to corresponding contacts on PCB 299 (pads on lower face 295, not shown), the optical axis of VCSEL die 211 is secured at the predetermined angle θ.

Figure 8:
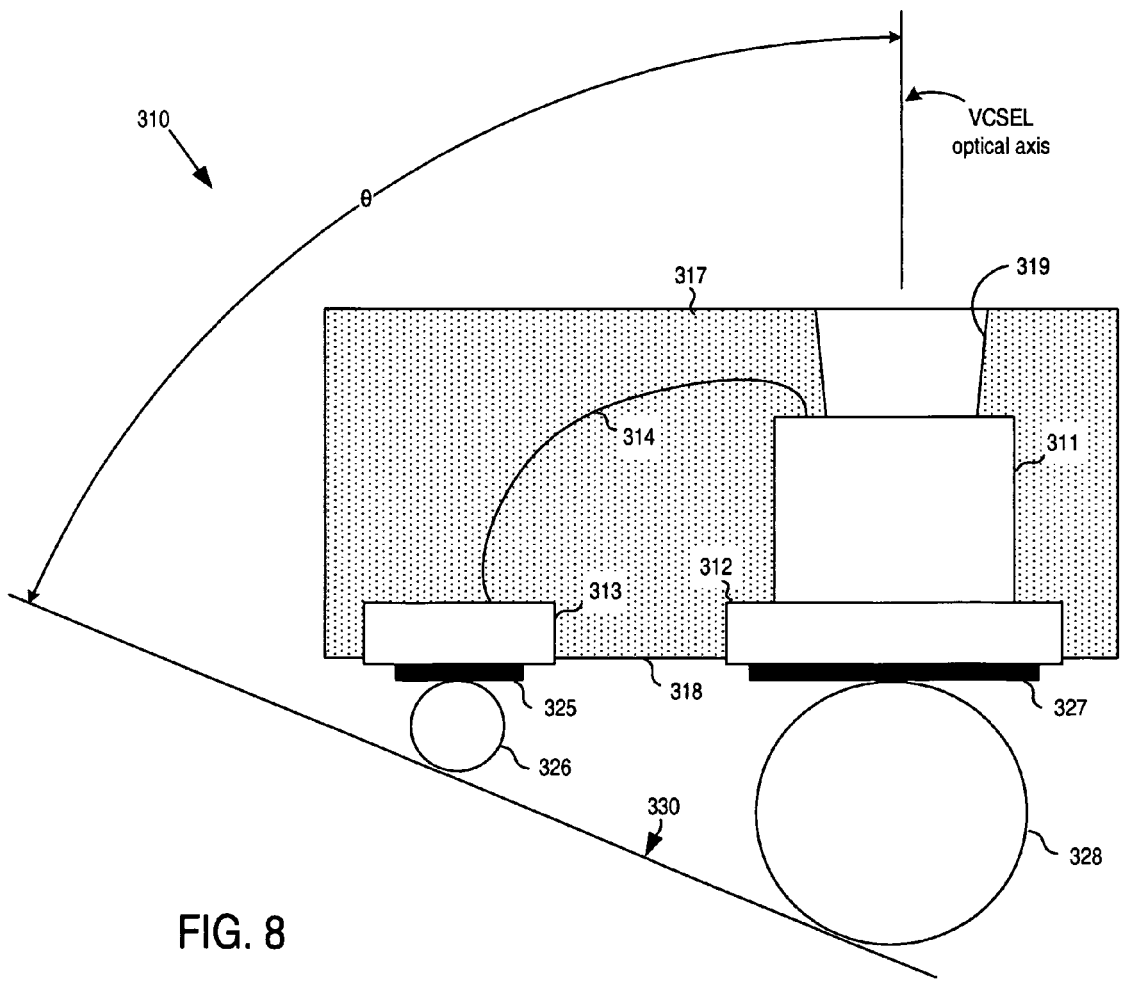
FIG. 8 is a cross-sectional diagram of a VCSEL package according to a further exemplary embodiment.

FIG. 8 is a cross-sectional diagram showing a VCSEL package 310 according to another embodiment. One face of VCSEL die 311 is bonded to lead frame 312 with electrically conductive adhesive (not shown). A wire 314 connects the other face of VCSEL die 311 to lead frame 313. Lead frames 312 and 313, wire 314 and VCSEL die 311 are enclosed (in whole or in part) within package material 317, which may be similar to package material described in connection with earlier embodiments. An opening 319 exposes the emitting cavity of VCSEL die 311. As in previously-described embodiments, the volume of opening 319 may be filled (in whole or in part) with a clear epoxy or other transparent material, or may be open to the air. VCSEL package 310 is also configured for surface mounting upon a PCB, and is "pre-bumped" with solder bumps 326 and 328. Under ball metallurgy (UBM) layers 325 and 327 are applied to the surfaces of lead frames 313 and 312 exposed through mounting surface 318. UBM layers 325 and 327 (which may be formed from, e.g., titanium/tungsten, copper, or gold) are sized so that bumps 326 and 328 also have different sizes. In particular, bumps 326 and 328 are sized so that a plane 330 tangent to bumps 326 and 328 is at a predetermined angle θ to the optical axis of VCSEL die 311. In some embodiments, predetermined angle θ is between five and eighty-five degrees. In other embodiments, that predetermined angle may be between zero and ninety degrees.

Figure 9:
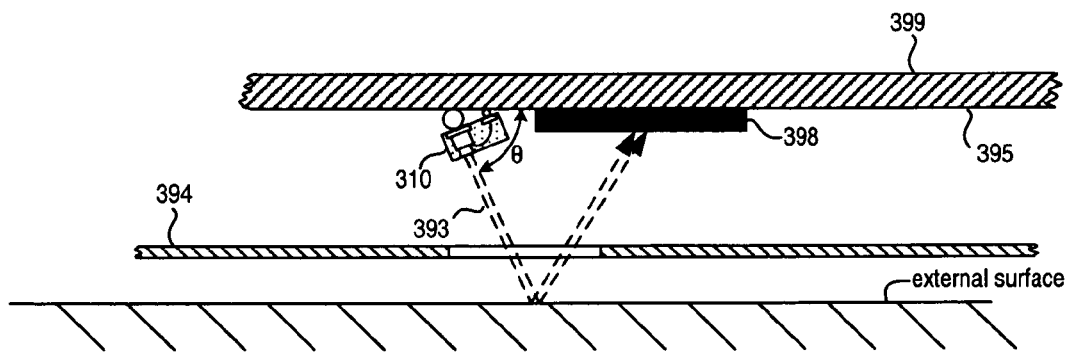
FIG. 9 is a cross-sectional diagram showing one example of how the VCSEL package of FIG. 8 may be incorporated into a computer mouse.

When VCSEL package 310 is later assembled into a mouse or other electronic device, and as shown in the cross-sectional diagram of FIG. 9, VCSEL package 310 is placed into its proper location on a lower face 395 of PCB 399. In particular, bumps 326 and 328 are placed into contact with corresponding electrical contacts (pads, not shown) on lower face 395. In this manner, the optical axis of VCSEL die 311 is oriented at the predetermined angle θ relative to lower face 395. After heat is applied and bumps 326 and 328 are melted, the optical axis of VCSEL die 311 is secured at the predetermined angle θ. Beam 393 thereby emanates from VCSEL die 311 at the angle θ to lower face 395. Also shown in FIG. 9 is a portion of the mouse housing 394 and a sensor package 398.

Figure 10:
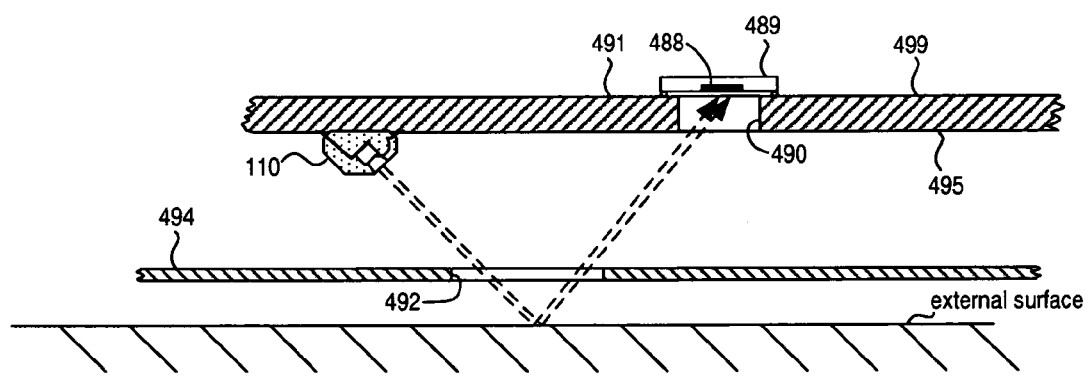
FIG. 10 is a cross-sectional diagram showing an embodiment in which a flip-chip is used.

FIG. 10 is a cross-sectional diagram illustrating an embodiment employing "flip-chip" assembly. In flip-chip assembly, and as is known in the art, an electronic chip is inverted and attached directly to a PCB or other substrate. The surface of the chip facing the substrate includes pads for electrically connecting the chip to other device electronics. Those pads are bonded to corresponding pads on the substrate using bumps of conductive adhesive or solder. Although flip-chip assembly per se is known, its use in the manner described herein is believed to be novel.

FIG. 10 shows a VCSEL package 110 (as described in connection with FIG. 4). Similar to FIGS. 3, 5 and 7, FIG. 10 also shows portions of a PCB 499 and a housing 494 of a computer mouse. VCSEL package 110 is attached to the lower face 495 of PCB 499 in a manner similar to that described in connection with FIG. 5. Unlike previous drawing figures, however, sensor IC 489 is attached to the upper surface 491 of PCB 499. In particular, sensor IC 489 is attached to PCB 499 using a flip-chip assembly technique. Also shown in FIG. 10 is an array of photosensitive elements 488 forming a portion of sensor IC 489. Sensor IC 489 is positioned so that array 488 is located over an opening 490 in PCB 499. In this manner, light from VCSEL package 110 returned by the external surface through an opening 492 in housing 494 reaches array 488. Although VCSEL package 110 is shown in FIG. 10, the embodiments described in connection with FIGS. 2, 6, 8 and 16-17 (discussed below) could also be used in conjunction with a sensor IC positioned on an opposite surface of a PCB.

Figure 11:
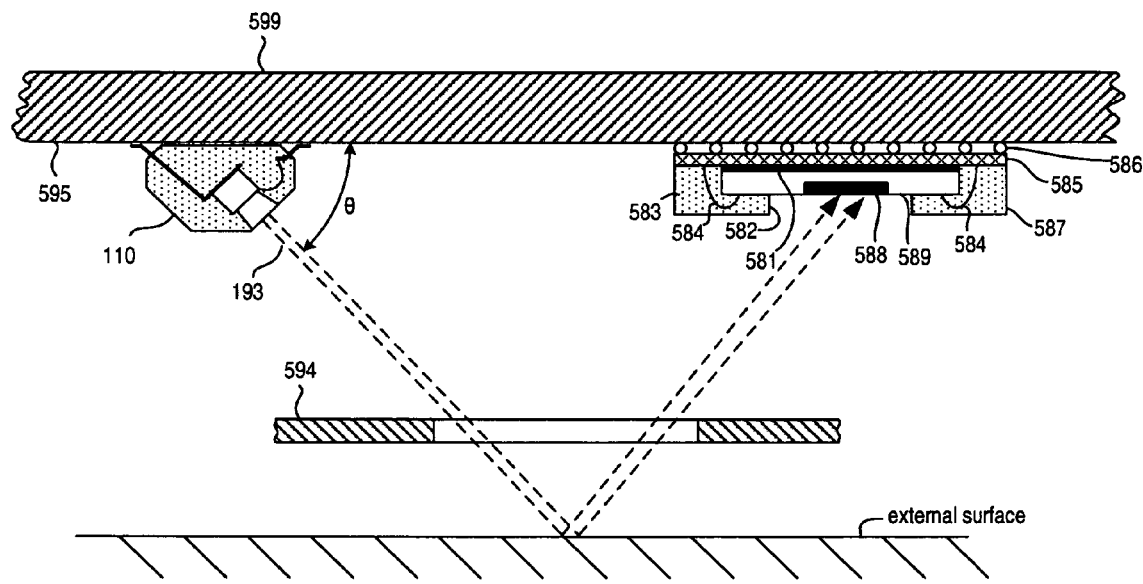
FIG. 11 is a cross-sectional diagram showing an embodiment in which a chip scale package is used.

FIG. 11 is a cross-sectional diagram showing an embodiment in which a chip scale package (CSP) is used in connection with a sensor IC. Shown in FIG. 11 is a sensor package 587. Sensor package 587 includes a sensor IC 589 having an array 588 of photosensitive elements. Sensor IC 589 is bonded to an interposer 585 with non-conductive adhesive 581. Multiple wires 584 electrically connect pads (not shown) on sensor IC 589 to pads (also not shown) on the face of interposer 585 confronting sensor IC 589. The pads on the IC face of interposer 585 are electrically connected to pads on the face of interposer 585 confronting the lower face 595 of mouse PCB 599. Solder bumps 586 connect the pads on the PCB face of interposer 585 to corresponding pads (not shown) on lower face 595 of PCB 599. Sensor IC 589 and wires 584 are contained within package material 583 (which may be similar to package material previously described). An opening 582 in package material 583 exposes array 588. The volume of opening 582 may be filled (in whole or in part) with a clear epoxy or other transparent material, or may be open to the air.

As further illustrated in FIG. 11, a VCSEL package 110 is also attached to the lower face 595 of PCB 599. VCSEL packages according to other embodiments could alternatively be employed. Beam 193 from VCSEL package 110 emanates from VCSEL die 111 at an angle θ to lower PCB face 595. Beam 193 exits the mouse through an opening in mouse housing 594, strikes the external surface, and returns through that housing opening to strike array 588 of sensor IC 589.

Figure 12A:
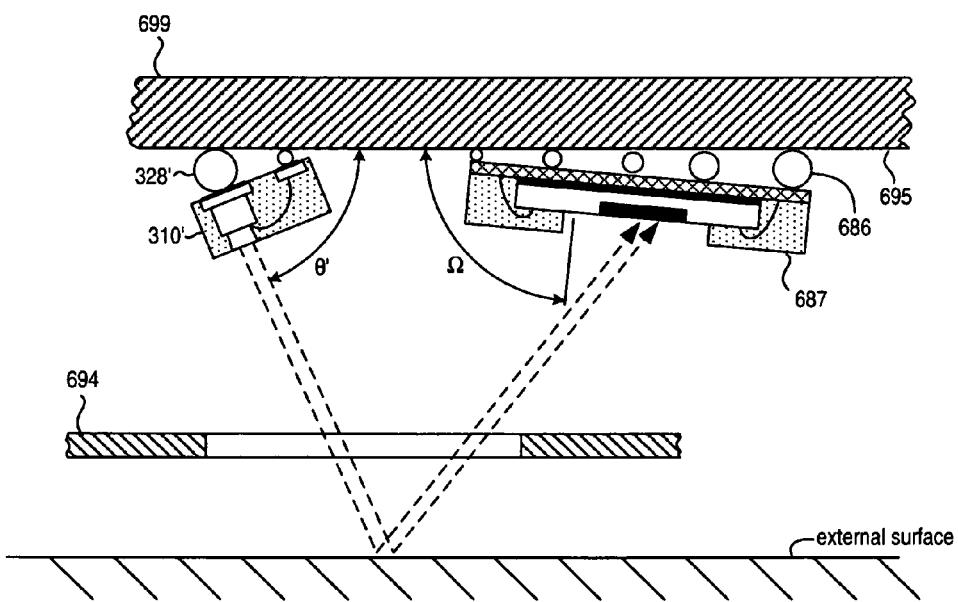
FIGS. 12A and 12B are cross-sectional diagrams showing additional embodiments in which a chip scale package is used.
Figure 12B:
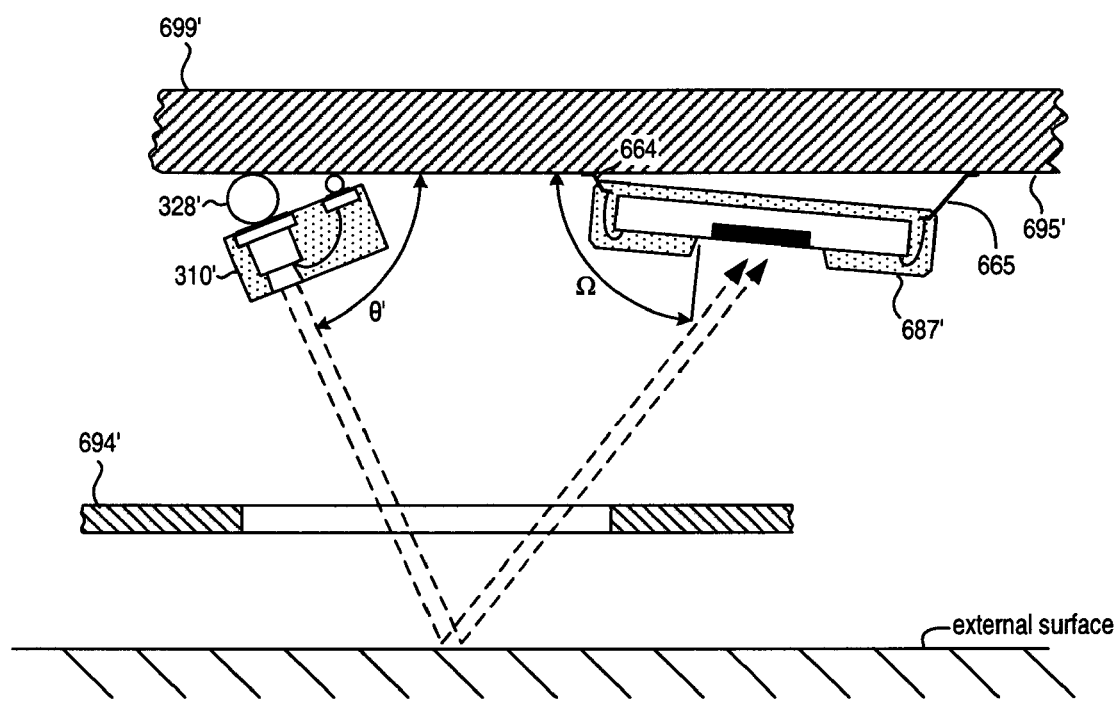

FIG. 12A is a cross-sectional diagram showing another embodiment in which a CSP is used for the sensor IC. In the embodiment of FIG. 12A, however, CSP sensor package 687 is attached to the lower face 695 of a mouse PCB 699 using different sized solder bumps 686. In this manner, and as further shown in FIG. 12A, an axis normal to the array in a sensor IC of sensor package 687 is oriented at an angle Ω relative to lower PCB face 695. Angularly orienting the sensor IC of sensor package 687 permits, e.g., orienting the emitter at an angle that is more perpendicular to lower face 695. For example, VCSEL package 310' in FIG. 12 is similar to VCSEL package 310 of FIGS. 8 and 9, but is oriented (by using a smaller solder bump 328') so as to emit beam 393' an angle θ' relative to PCB lower face 695 (where θ'>θ of FIGS. 8 and 9). In some embodiments, angle θ' may range from zero to ninety degrees, and angle Ω may range from forty-five to ninety degrees. In variations on the embodiment of FIG. 12A, VCSEL packages similar to other embodiments are used. In certain embodiments, a vertically-oriented VCSEL package is used (i.e., a package in which the beam is perpendicular to the PCB when the VCSEL package is installed). In yet other embodiments, and as shown in FIG. 12B, lead frames 665 and 664 are used instead of different sized solder bumps to achieve an angled orientation of a sensor package 687' relative to lower face 695'. Similar to emitter packages described in connection with FIGS. 4 and 6, wires connect the sensor IC to lead frames 664 and 665 that extend through the package material of sensor package 687'.

Figure 13:
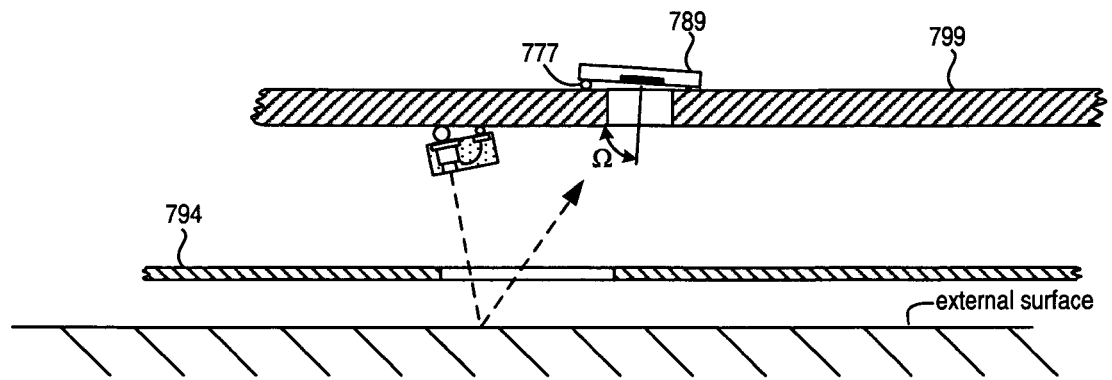
FIG. 13 is a cross-sectional diagram showing a variation on the embodiment of FIG. 12A.

FIG. 13 is a cross-sectional diagram showing another variation on the embodiment of FIG. 12A. Similar to FIG. 12A, sensor IC 789 is oriented at an angle Ω relative to PCB 799. In the embodiment of FIG. 13, however, sensor IC 789 is a flip-chip instead of a CSP. The angle Ω is achieved by use of different sized adhesive bumps 777.

Figure 14:
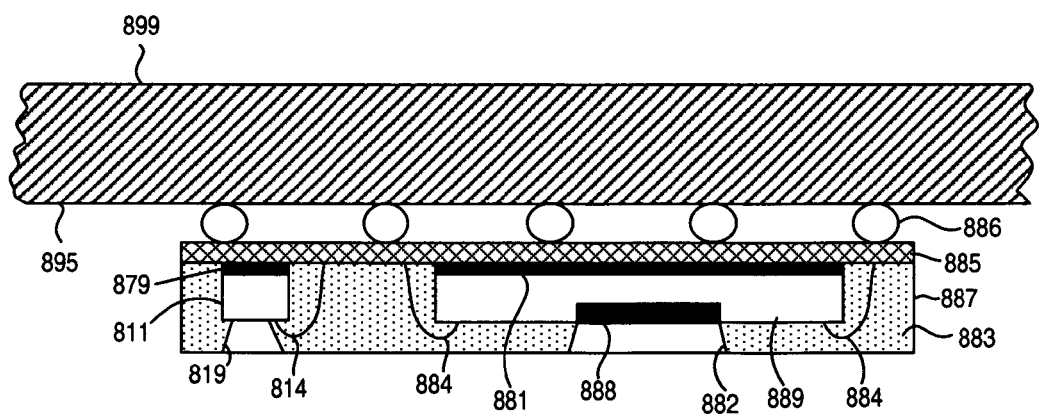
FIG. 14 is a cross-sectional diagram showing an embodiment in which a VCSEL and a sensor IC are contained within a single package.

FIG. 14 is a cross-sectional diagram showing an embodiment in which a VCSEL die 811 and a sensor IC 889 are contained in a single chip scale package 887. Similar to the embodiment of FIG. 11, sensor IC 889 includes an array 888 of photosensitive elements. Sensor IC 889 is bonded to an interposer 885 with a non-conductive adhesive 881. Wires 884 electrically connect pads (not shown) on sensor IC 889 to pads (also not shown) on the IC face of interposer 885. The pads on the IC face of interposer 885 are electrically connected to pads on the PCB face of interposer 885, with solder bumps 886 connecting the PCB face pads of interposer 885 to corresponding pads (not shown) on lower face 895 of mouse PCB 899.

A face of VCSEL die 811 is also bonded to a pad (not shown) on interposer 885. However, VCSEL die 811 is bonded with conductive adhesive 879. Wire 814 connects the opposite face of VCSEL 811 to another pad on interposer 885. The pads to which VCSEL 811 and wire 814 are joined are connected to corresponding pads on the PCB face of interposer 885, with those PCB face pads also being joined to pads on PCB 899 with solder balls 886. Sensor IC 889, VCSEL die 811, wires 884 and wire 814 are contained (in whole or in part) within package material 883 (which may be similar to package material previously described). In some embodiments, package material 883 is a clear resin or other transparent material with a glass transition temperature of 90° C. to 175° C. (such a package material could also be used for embodiments described in connection with FIGS. 2, 4, 6, 8, 11-12B, 15A-15C and 16-17). Openings 819 and 882 in package material 883 respectively expose the emitting cavity of VCSEL die 811 and array 888 of sensor IC 889. One or both of those openings may be completely open, or may be filled (in whole or in part) with a clear epoxy or other transparent material (e.g., if a clear resin or other transparent material is used for package material 883).

Figure 15A:
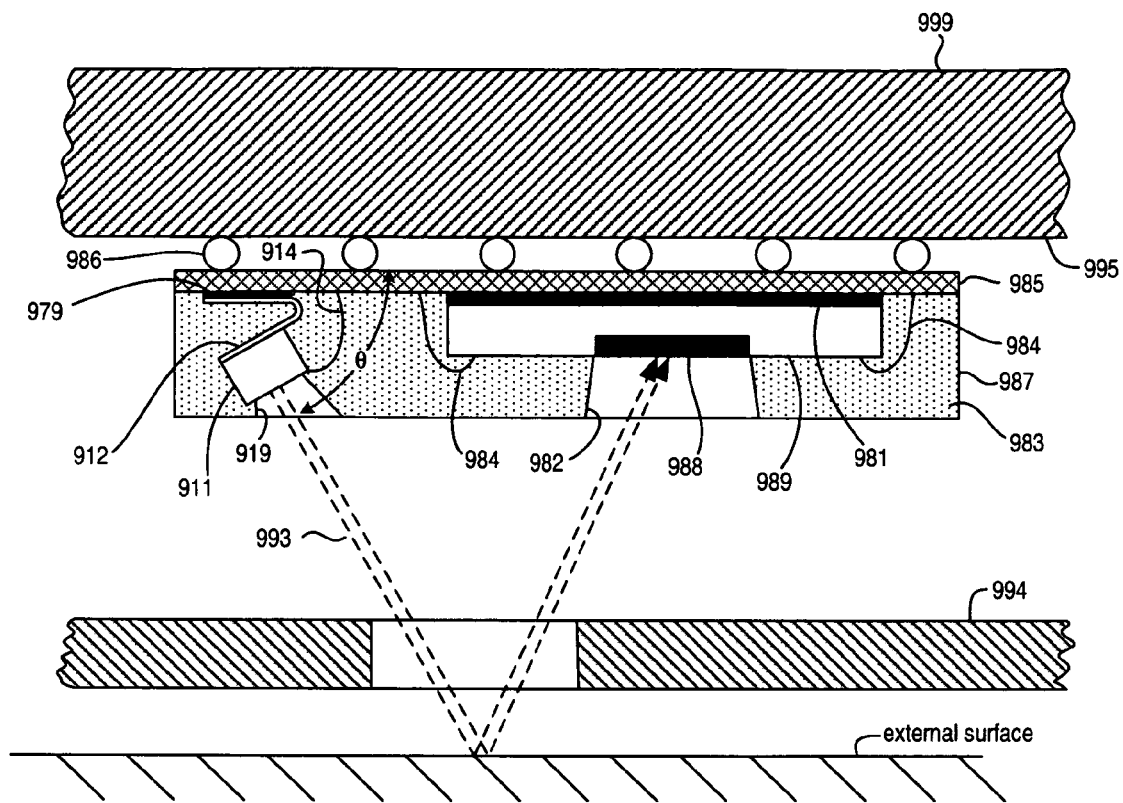
FIGS. 15A through 15C are a cross-sectional diagrams showing variations on the embodiment of FIG. 14.

In the embodiment of FIG. 14, a beam emitted by VCSEL die 811 will be perpendicular to the receiving plane of array 888. Depending upon the design of sensor IC 889 and other factors, such an orientation may be acceptable. In other applications, however, it may be desirable for the VCSEL die in a combined VCSEL/sensor package to have an angular orientation similar to the orientations of the VCSEL dies in the packages shown in FIGS. 2, 4, 6 and 8. FIG. 15A is a cross-sectional diagram showing a variation on the embodiment of FIG. 14 in which this angular VCSEL orientation is provided. Combined VCSEL/sensor package 987 of FIG. 15A is generally similar to package 887 of FIG. 14, with similar components having similar reference numbers (e.g., VCSEL die 911 of FIG. 15A is similar to VCSEL die 811 of FIG. 14). In the embodiment of FIG. 15A, however, a lead frame 912 is added so as to orient the optical axis of VCSEL die 911 at an angle θ (e.g., five to eighty-five degrees) relative to the plane of array 988. In this manner, beam 993 is directed through an opening in housing 994 onto a portion of the external surface which is imaged or otherwise monitored by sensor IC 989.

Figure 15B:
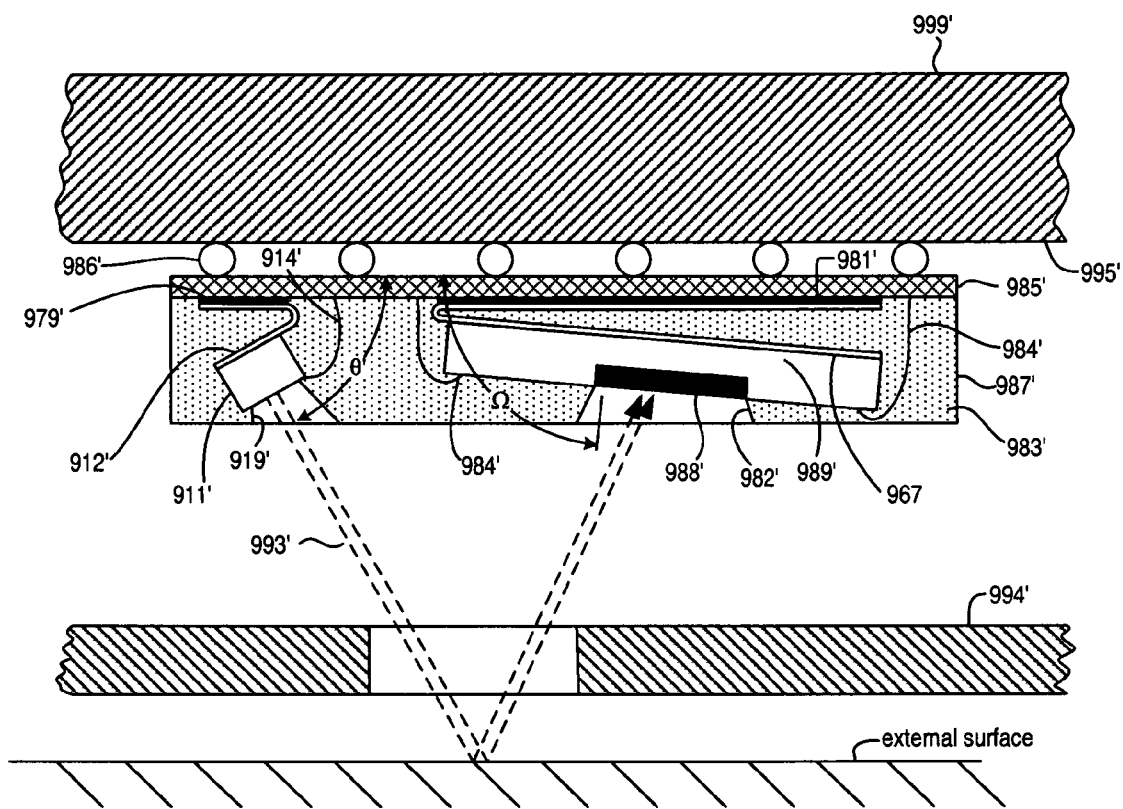

FIG. 15B is a cross-sectional diagram showing a variation on the embodiment of FIG. 15A in which angular orientation is provided for both the VCSEL and for the sensor package. Combined VCSEL/sensor package 987' of FIG. 15B is generally similar to package 987 of FIG. 15A, with similar components having similar reference numbers (e.g., VCSEL die 911 of FIG. 15A is similar to VCSEL die 911' of FIG. 15B). In the embodiment of FIG. 15B, sensor IC 989' is bonded to a lead frame 967, which lead frame is in turn bonded to interposer 985'. In the embodiment of FIG. 15B, lead frame 967 does not provide electrical contacts between sensor IC 989' and points on interposer 985'. Such electrical contacts are provided by wires 984'. Instead, lead frame 967 positions IC sensor 989' within package 987' such that array 988' is at a non-parallel angle to face 995' of PCB 999'. In some embodiments, angle θ' is between zero and ninety degrees, and angle Ω is between forty-five and ninety degrees.

Figure 15C:
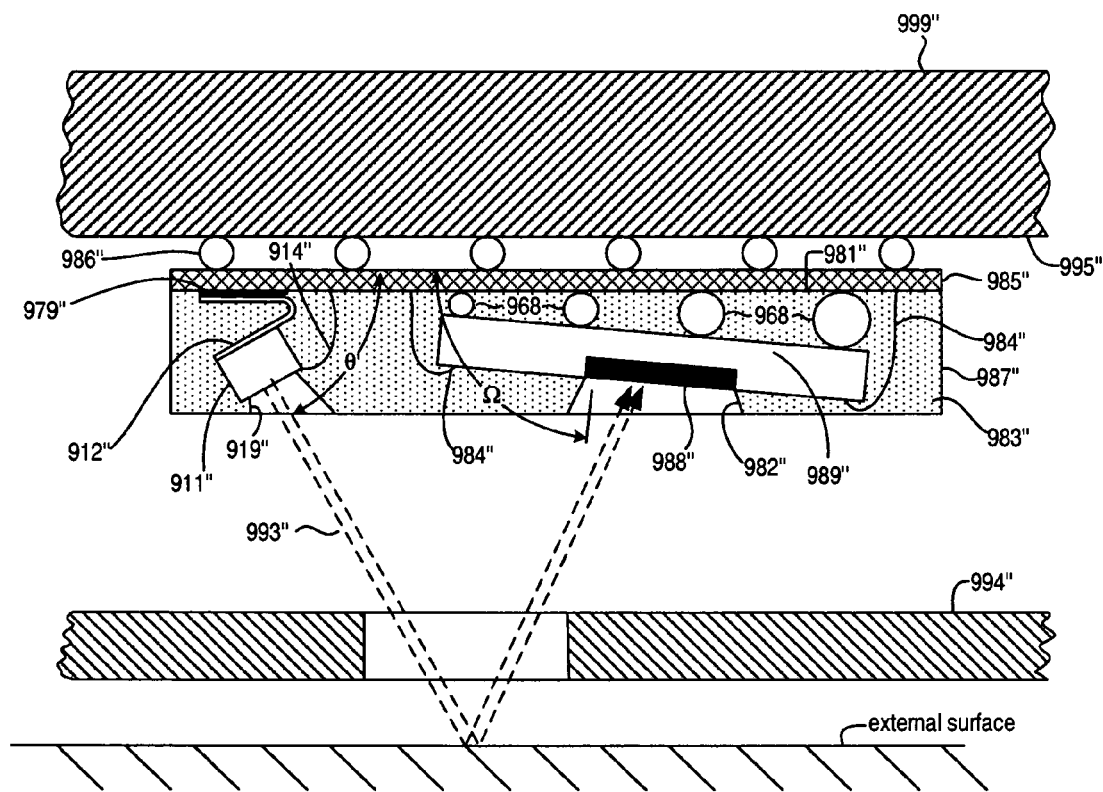

FIG. 15C is a cross-sectional diagram showing a variation on the embodiment of FIG. 15B. Similar components in FIGS. 15B and 15C have similar reference numbers (e.g., VCSEL die 911' of FIG. 15B is similar to VCSEL die 911" of FIG. 15C). In the embodiment of FIG. 15C, the angular orientation of sensor IC 989" (angle Ω) is achieved with different sized solder balls 968 instead of a lead frame. As with lead frame 967 in the embodiment of FIG. 15B, solder balls 968 do not electrically connect sensor IC 989" to interposer 985".

Figure 16:
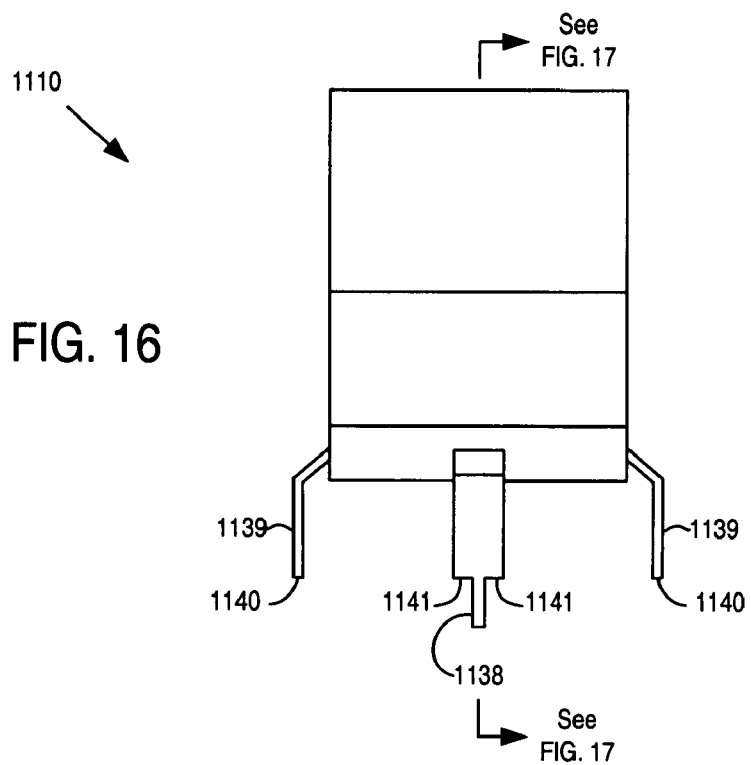
FIG. 16 is a rear view of a VCSEL package according to another exemplary embodiment.
Figure 17:
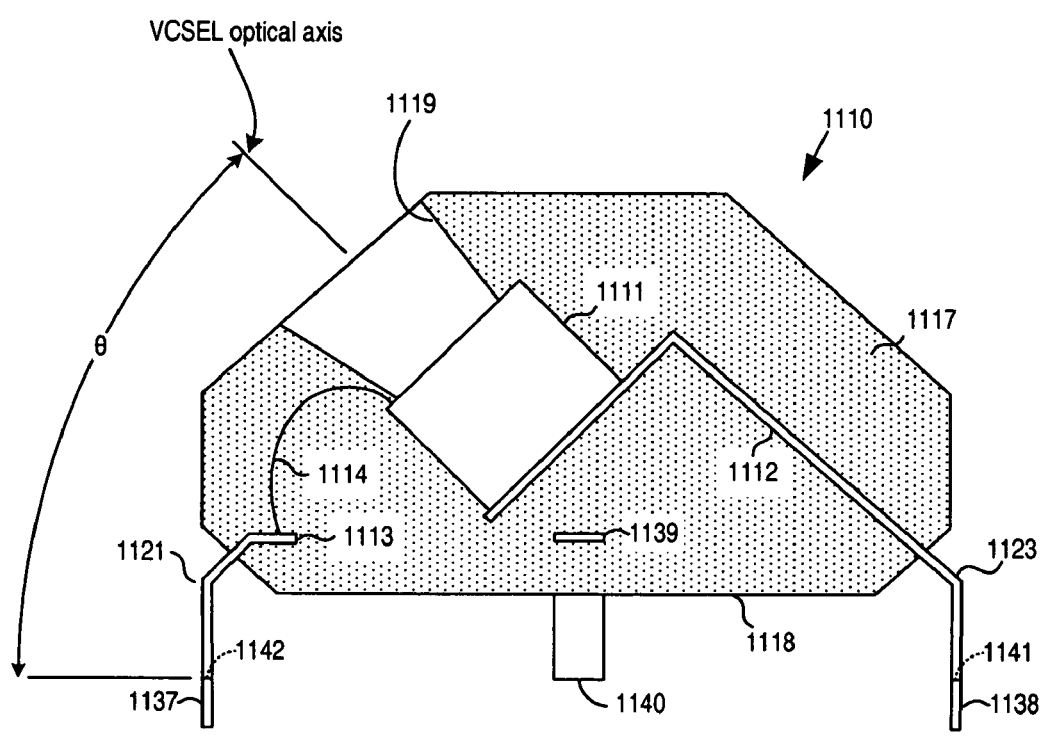
FIG. 17 is a cross-sectional view of the VCSEL package of FIG. 16

FIG. 16 is a rear view of a VCSEL package 1110 according to another embodiment. FIG. 17 is a cross-sectional view of VCSEL package 1110 taken along the line indicated in FIG. 16. VCSEL package 1110 is similar to VCSEL package 110 of FIG. 4 (with similar components having similar reference numbers), but is configured for through-hole mounting on a PCB instead of surface mounting. Lead frames 1112 and 1113 include respective ends 1123 and 1121 extending from package material 1117. A pin 1138 is formed in lead frame end 1123. Shoulders 1141 are formed on sides of pin 1138, as seen in FIG. 16. Similarly, a pin 1137 is formed in lead frame end 1121. Shoulders 1142 are formed on sides of pin 1137. A dummy lead frame 1139 (i.e., a lead frame to which no electrical connection is made) is partially enclosed within package material 1117 at a position transverse to lead frames 1112 and 1114. Exposed portions of dummy lead frame 1149 terminate in edges 1140; edges 1140 are on the same plane as shoulders 1141 and 1142. VCSEL die 1111 (secured to lead frame 1112 with conductive adhesive) is positioned within package material 1117 so that the optical axis of VCSEL die 1111 is at a predetermined angle θ relative to the plane of edges 1140 and shoulders 1141 and 1142.

VCSEL package 1110 is installed on a PCB by positioning pins 1137 and 1138 in through-holes on the PCB. Shoulders 1141 and 1142, as well as edges 1140, rest against the PCB surface and orient the optical axis of VCSEL die 1111 at the predetermined angle θ (e.g., five to eighty-five degrees; zero to ninety degrees) relative to the PCB. When pins 1137 and 1138 are soldered to their corresponding through-holes, the optical axis of VCSEL die 1111 is secured at the predetermined angle θ.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A packaged electronic component, comprising:
an emitting element die having an optical axis along which light is output in response to application of electrical energy to the die;
electrical leads positioned to convey electrical energy between the die and points external to the component; and
package material at least partially enclosing the die and the electrical leads, and wherein
a plurality of points on the component define a mounting plane,
placement of the component onto a printed circuit board (PCB) in preparation for attachment of the component thereto places the plurality of points into contact with the PCB, and
the angle of the optical axis relative to the mounting plane is between five and eighty-five degrees.

2. The packaged electronic component of claim 1, wherein the emitting element die is one of a vertical cavity surface emitting laser die, an edge emitting laser diode die and a light emitting diode die.

3. The packaged electronic component of claim 2, wherein
the component is configured for through-hole mounting on the PCB, and
the electrical leads include portions configured for placement into holes formed in the PCB.

4. The packaged electronic component of claim 3, wherein the component includes a generally flat mounting face which rests against the PCB when the electrical lead portions are placed into the holes formed in the PCB.

5. The packaged electronic component of claim 3, wherein
the electrical leads include shoulders adjacent to the portions configured for placement into the holes formed in the PCB, and
at least some of the plurality of points are located on the shoulders.

6. The packaged electronic component of claim 2, wherein
the electrical leads include first and second lead frames partially enclosed in the package material, and
regions of the first and second lead frames not enclosed in the package material are flattened and form mounting pads configured for attachment to corresponding electrical contacts on the PCB.

7. The packaged electronic component of claim 6, wherein the plurality of points defining a mounting plane are located on the mounting pads.

8. The packaged electronic component of claim 2, further comprising:
a sensor integrated circuit (IC), the sensor IC including an array of elements sensitive to the light output by the emitting element die, and wherein the package material at least partially encloses the sensor IC and includes a region permitting light to reach the array.

9. The packaged electronic component of claim 2, further comprising a PCB, and wherein
the packaged electronic component is attached to the PCB and the mounting plane is parallel to the PCB.

10. The packaged electronic component of claim 9, further comprising a separately-packaged sensor integrated circuit (IC), the sensor IC including an array of elements sensitive to the light output by the emitting element die, and wherein
the PCB has upper and lower faces,
the packaged electronic component is attached to the lower face,
the sensor IC is attached to the upper face.

11. The packaged electronic component of claim 10, wherein the sensor IC is attached to the upper face using a flip-chip technique.

12. The packaged electronic component of claim 9, further comprising a chip scale package (CSP) sensor integrated circuit (IC), the CSP sensor IC including an array of elements sensitive to the light output by the emitting element die, and wherein the packaged electronic component and the CSP sensor IC are attached to a single face of the main PCB.

13. The packaged electronic component of claim 12, wherein the CSP sensor IC includes:
IC electrical leads positioned to convey electrical energy between the CSP sensor IC and points external to the CSP sensor IC,
package material at least partially enclosing the CSP sensor IC and the IC electrical leads, and wherein
a plurality of points on the CSP sensor IC define an IC mounting plane,
placement of the CSP sensor IC onto the PCB in preparation for attachment thereto places the plurality of points defining the IC mounting plane into contact with the PCB, and
the angle, relative to the IC mounting plane, of an axis normal to the array is between forty-five and eighty-five degrees.

14. A packaged electronic component, comprising:
an emitting element die having an optical axis along which light is output in response to application of electrical energy to the die;
first and second electrical contacts positioned to convey electrical energy between the die and points external to the component;
package material at least partially enclosing the die and the first and second electrical contacts; and
first and second solder bumps attached to the component and in respective electrical communication with the first and second electrical contacts, and wherein
the first and second solder bumps are of different sizes,
the first and second solder bumps are sized and positioned such that placement of the first and second bumps into contact with a printed circuit board (PCB) in preparation for attachment of the component thereto orients the optical axis at an angle to the PCB of between five and eighty-five degrees.

15. The packaged electronic component of claim 14, further comprising:
a computer mouse having a main PCB; and
a sensor integrated circuit (IC) component including an array of elements sensitive to light, and wherein
the sensor IC component is shaped such that placement of the component on the main PCB in preparation for attachment thereto orients the array in a position which is not perpendicular or parallel to the main PCB.

16. The packaged electronic component of claim 15, wherein
the sensor IC component includes sensor package material at least partially enclosing the sensor IC,
the sensor IC component further includes multiple solder bumps attached to the sensor IC component and in electrical communication with the sensor IC, and wherein
the multiple solder bumps are of different sizes,
the multiple solder bumps are sized and positioned such that placement of the multiple solder bumps into contact with the main PCB in preparation for attachment thereto of the sensor IC component orients an axis normal to the array at an angle to the main PCB of between forty-five and eighty-five degrees.

17. The packaged electronic component of claim 15, wherein
the sensor IC component is a chip scale package configured for surface mounting on the main PCB, and
the array faces away from the main PCB when the component is mounted thereon.

18. The packaged electronic component of claim 15, wherein
the sensor IC component is configured for flip-chip mounting on the main PCB, and
the array faces the main PCB when the sensor IC component is mounted thereon.

19. A packaged electronic component, comprising:
a vertical cavity surface emitting laser (VCSEL) die;
a sensor integrated circuit (IC) including an array of elements sensitive to light output by the VCSEL die;
package material at least partially enclosing the VCSEL die and the sensor IC, the package material including a first region permitting light to exit an emitting cavity of the VCSEL die and a second region allowing light to reach the array;
a plurality of electrical contacts, each of the electrical contacts in electrical communication with at least one of the VCSEL die and the sensor IC, each of the electrical contacts further having a portion configured for attachment to a corresponding electrical contact on a printed circuit board (PCB); and
a mounting side which faces the PCB when the component electrical contacts are attached to the PCB corresponding contacts, and wherein
the emitting cavity and array face away from the mounting side.

20. The packaged electronic component of claim 19, wherein
the VCSEL die has an optical axis along which light is output from the emitting cavity,
the optical axis is at a predetermined angle relative to the mounting side and to the array, and
the predetermined angle is not perpendicular or parallel to the mounting side or to the array.

\* \* \* \* \*